(12) United States Patent  
Sugihara

(10) Patent No.: US 7,281,181 B2  
(45) Date of Patent: Oct. 9, 2007

(54) SYSTEMS, METHODS AND COMPUTER PROGRAMS FOR CALIBRATING AN AUTOMATED CIRCUIT TEST SYSTEM

(75) Inventor: Noriyuki Sugihara, Campbell, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 174 days.

(21) Appl. No.: 11/168,033

(22) Filed: Jun. 27, 2005

(65) Prior Publication Data

US 2007/0022347 A1      Jan. 25, 2007

(51) Int. Cl.
  *G01R 31/28*  (2006.01)
  *G01R 27/02*  (2006.01)
(52) U.S. Cl. ..................... 714/724; 324/606
(58) Field of Classification Search ................ None
  See application file for complete search history.

(56) References Cited

U.S. PATENT DOCUMENTS

| | | | | |
|---|---|---|---|---|
| 5,703,489 | A * | 12/1997 | Kuroe | 324/601 |
| 6,105,157 | A * | 8/2000 | Miller | 714/744 |
| 6,192,496 | B1 * | 2/2001 | Lawrence et al. | 714/724 |
| 6,469,514 | B2 * | 10/2002 | Okayasu | 324/532 |
| 6,586,924 | B1 * | 7/2003 | Okayasu et al. | 324/158.1 |
| 6,606,575 | B2 * | 8/2003 | Miller | 702/104 |
| 6,622,103 | B1 * | 9/2003 | Miller | 702/89 |
| 6,804,620 | B1 * | 10/2004 | Larson et al. | 702/91 |
| 6,979,996 | B2 * | 12/2005 | Fleishman | 324/158.1 |
| 7,043,959 | B2 * | 5/2006 | Ibane | 73/1.42 |
| 7,120,840 | B1 * | 10/2006 | Shimanouchi | 714/700 |
| 7,121,132 | B2 * | 10/2006 | Ibane | 73/1.42 |

FOREIGN PATENT DOCUMENTS

JP      2001215261 A  *  8/2001

OTHER PUBLICATIONS

"Adaptive enhancement of timing accuracy and waveform quality inhigh-performance IC testers" Charoen et al. This paper appears in: Circuits and Systems I: Fundamental Theory and Applications, IEEE Transactions on Publication Date: Feb. 1992 vol. 39, Issue: 2 On pp. 139-151ISSN: 1057-7122 INSPEC Accession No. 4135755.*

* cited by examiner

*Primary Examiner*—Cynthia Britt

(57) ABSTRACT

In one embodiment, an automated circuit test system is calibrated by electrically coupling a first calibration unit between a plurality of drivers and comparators of the test system, and then executing an AC timing calibration procedure to determine a timing delay for each of a first set of relationships. A second calibration unit is then electrically coupled between the plurality of drivers and comparators, and an AC timing calibration procedure is executed to determine a timing delay for each of a second set of relationships. The first and second calibration units comprise fixed wiring paths that respectively couple pairs of the drivers and comparators in accord with the first and second sets of relationships. A set of equations is solved based on the timing delays and driver/comparator relationships to determine relative timing errors introduced by signal paths of the test system including the drivers and comparators.

2 Claims, 5 Drawing Sheets

SYSTEMS, METHODS AND COMPUTER PROGRAMS FOR CALIBRATING AN AUTOMATED CIRCUIT TEST SYSTEM

BACKGROUND

Prior to the manufacture and/or distribution of an electrical device (including a system or component such as a circuit board, integrated circuit, or system-on-a-chip (SOC)), the device is typically tested to determine whether it is built or functions as designed. Often, this testing is performed by an automated circuit test system (also known as automated test equipment (ATE)).

For the results of the test system to be meaningful, the system needs to be calibrated. That is, the intrinsic system errors that the test system may introduce during testing must be quantified.

To characterize the test system's intrinsic system errors, a calibrated driver may be sequentially coupled to each of the system's test signal comparators. A test signal initiated by the calibrated driver may then be read by each of the comparators; and the signals read by the comparators may be compared to an expected signal to determine their deviation therefrom. Likewise, a calibrated comparator may be sequentially coupled to each of the system's drivers. Test signals initiated by the drivers may then be read by the calibrated comparator; and the signals read by the calibrated comparator may be compared to an expected signal to determine their deviation therefrom.

In order to characterize a test system's intrinsic system errors using the above method, each of the system's drivers and comparators must be probed for the purpose of connecting it to the calibrated driver or comparator. One way to undertake such probing is via a robot that sequentially couples a calibrated testhead including a driver and a comparator to each of the test system's signal pins. However, such a robot is costly, and its mechanical tolerances are difficult to maintain.

Another way to undertake the probing of a test system's signal pins is via a relay signal selector. That is, a calibrated driver or comparator may be sequentially switched into contact with each of the system's drivers and comparators. However, relay signal selectors can cause signal degradation that makes system calibration difficult—especially during high-frequency AC timing calibration.

SUMMARY OF THE INVENTION

In one embodiment, a method for calibrating an automated circuit test system comprises electrically coupling a first calibration unit between a plurality of drivers and comparators of the test system. The first calibration unit comprises fixed wiring paths that couple pairs of the drivers and comparators in accord with a first set of relationships. While the first calibration unit is coupled between the plurality of drivers and comparators, an AC timing calibration procedure is executed to determine a timing delay for each of the first set of relationships. A second calibration unit is then electrically coupled between the plurality of drivers and comparators. The second calibration unit comprises fixed wiring paths that couple pairs of the drivers and comparators in accord with a second set of relationships. While the second calibration unit is coupled between the plurality of drivers and comparators, an AC timing calibration procedure is executed to determine a timing delay for each of the second set of relationships. Finally, a set of equations is solved based on the timing delays and driver/comparator relationships to determine 1) relative timing errors introduced by signal paths of the test system that include the drivers, and 2) relative timing errors introduced by signal paths of the test system that include the comparators.

In a second embodiment, a system for calibrating an automated circuit test system comprises first and second calibration units. Each calibration unit comprises 1) a driver interface having multiple driver contacts for electrically coupling the calibration unit to a plurality of drivers of the test system, 2) a comparator interface having multiple comparator contacts for electrically coupling the calibration unit to a plurality of comparators of the test system, and 3) a plurality of fixed wiring paths coupling pairs of the calibration unit's driver contacts and comparator contacts. The fixed wiring paths of the first calibration unit couple pairs of the calibration unit's driver and comparator contacts in accord with a first set of relationships, and the fixed wiring paths of the second calibration unit couple pairs of the second calibration unit's driver and comparator contacts in accord with a second set of relationships.

In a third embodiment, a method for calibrating an automated circuit test system comprises electrically coupling a first calibration unit between a plurality of drivers and comparators of the test system. The first calibration unit comprises fixed wiring paths that couple pairs of the drivers and comparators in accord with a first set of relationships. While the first calibration unit is coupled between the plurality of drivers and comparators, a resistance check is executed to determine resistances for signal paths defined by the first set of relationships. A second calibration unit is then electrically coupled between the plurality of drivers and comparators. The second calibration unit comprises fixed wiring paths that couple pairs of the drivers and comparators in accord with a second set of relationships. While the second calibration unit is coupled between the plurality of drivers and comparators, a resistance check is executed to determine resistances for signal paths defined by the second set of relationships. Finally, a set of equations is solved based on the resistances and driver/comparator relationships to determine 1) relative resistances imparted by signal paths of the test system that include the drivers, and 2) relative resistances imparted by signal paths of the test system that include the comparators.

Other embodiments are also disclosed.

BRIEF DESCRIPTION OF THE DRAWING

Illustrative embodiments of the invention are illustrated in the drawings, in which.

DETAILED DESCRIPTION

Figure 1:
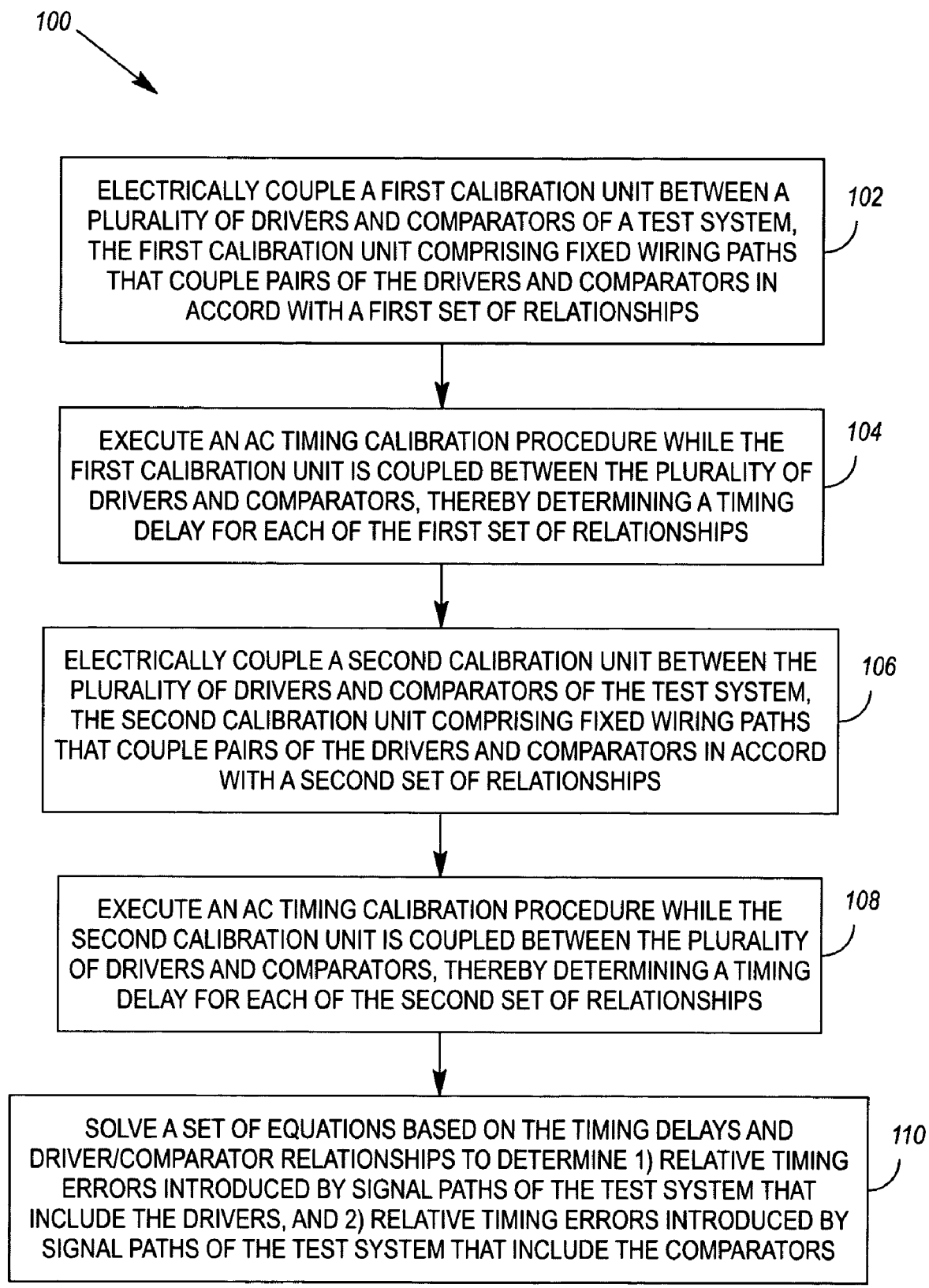
FIG. 1 illustrates a first exemplary method for calibrating an automated circuit test system.

FIG. 1 illustrates an exemplary method 100 for calibrating an automated circuit test system. The method 100 begins with the electrical coupling 102 of a first calibration unit 200

Figure 2:
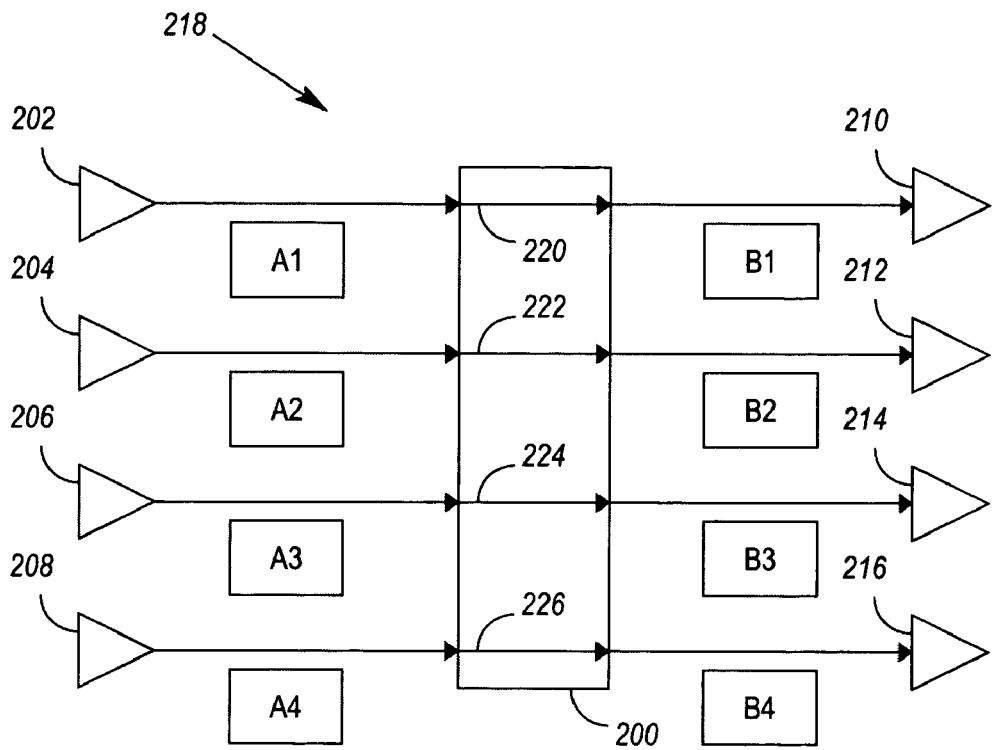
FIGS. 2-5 illustrate various connections that are formed between the drivers and comparators of a test system while first and second calibration units are coupled between its drivers and comparators during execution of the method shown in FIG. 1.

(FIG. 2) between a plurality of drivers 202, 204, 206, 208 and comparators 210, 212, 214, 216 of the test system 218. As shown in FIG. 2, the first calibration unit 200 comprises fixed wiring paths 220, 222, 224, 226 that couple pairs of the drivers 202-208 and comparators 210-216 in accord with a first set of relationships. By way of example, these relationships are shown to include a series connection between the driver 202 and the comparator 210 (including any wiring paths, switching circuits and other elements of an automated circuit test system, its probecard, and its test socket, that are coupled between the driver 202 and the comparator 210). Similarly to the series connection between driver 202 and comparator 210, the first calibration unit 200 may form a series connection between driver 204 and comparator 212, between driver 206 and comparator 214, and between driver 208 and comparator 216.

With the first calibration unit 200 in place, a first AC timing calibration procedure is executed 104 to determine a timing delay for each of the first set of relationships.

Figure 3:
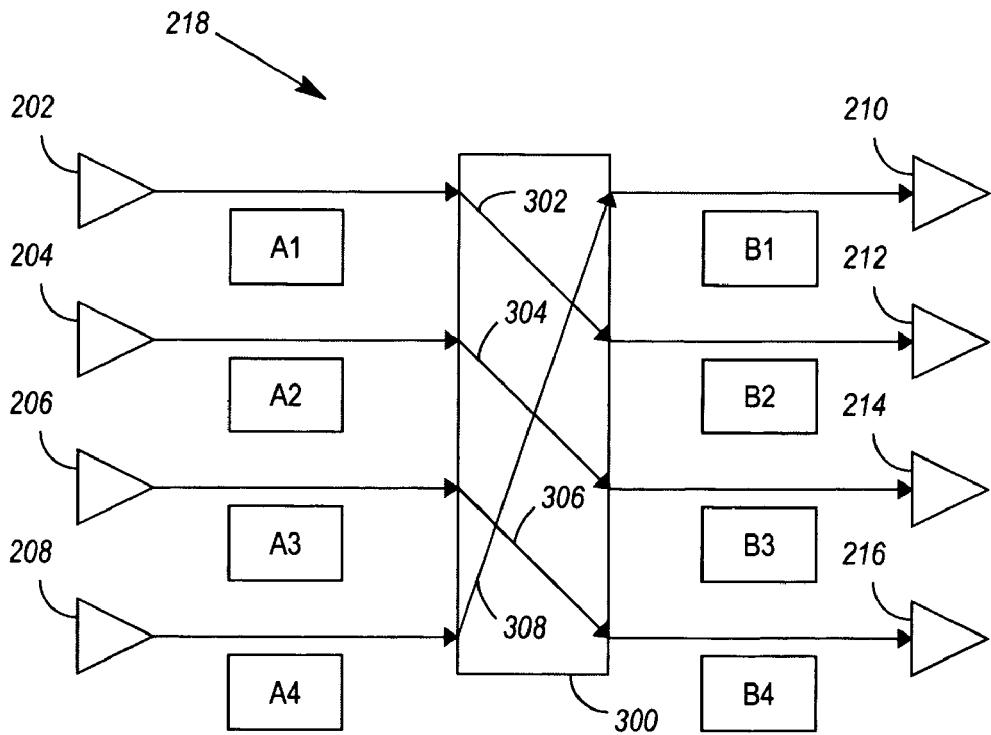

After conducting the first AC timing calibration procedure, a second calibration unit 300 (FIG. 3) is coupled 106 between the plurality of drivers 202-208 and comparators 210-216. As shown in FIG. 3, the second calibration unit 300 comprises fixed wiring paths 302, 304, 306, 308 that couple pairs of the drivers 202-208 and comparators 210-216 in accord with a second set of relationships (e.g., series connections between driver 202 and comparator 212, between driver 204 and comparator 214, between driver 206 and comparator 216, and between driver 208 and comparator 210). With the second calibration unit 300 in place, a second AC timing calibration procedure is executed 108 to determine a timing delay for each of the second set of relationships.

After conducting the first and second AC timing calibration procedures, a set of equations is solved 110 based on the timing delays and driver/comparator relationships. In this manner, one may determine 1) relative timing errors (e.g., timing errors A1, A2, A3 and A4) introduced by signal paths of the test system that include the drivers 202-208, and 2) relative timing errors (e.g., timing errors B1, B2, B3 and B4) introduced by signal paths of the test system that include the comparators 210-216.

By way of example, the first AC timing calibration procedure may comprise generating a plurality of test signals via the drivers 202-208, and capturing the test signals via the comparators 210-216, via the first calibration unit 200. In this manner, and assuming that any delay introduced by the first calibration unit 200 is negligible, a set of timing delays $T_{11}$, $T_{22}$, $T_{33}$ and $T_{44}$ may be acquired for the paths represented by timing errors A1-A4 and B1-B4 as follows:

$$T_{11}=A1+B1$$

$$T_{22}=A2+B2$$

$$T_{33}=A3+B3$$

$$T_{44}=A4+B4 \quad (1)$$

Also by way of example, the second AC timing calibration procedure may comprise generating a plurality of test signals via the drivers 202-208, and capturing the test signals via the comparators 210-216, via the second calibration unit 300. In this manner, and assuming that any delay introduced by the second calibration unit 300 is negligible, a set of timing delays $T_{12}$, $T_{23}$, $T_{34}$ and $T_{41}$ may be acquired for the paths represented by the timing errors A1-A4 and B1-B4 as follows:

$$T_{12}=A1+B2$$

$$T_{23}=A2+B3$$

$$T_{34}=A3+B4$$

$$T_{41}=A4+B1 \quad (2)$$

To solve the above equations to determine the relative timing errors introduced by the signal paths of the test system including the drivers 202-208, the second set of equations (2) may be subtracted from the first set of equations (1) to derive the timing errors $T_a$, $T_b$, $T_c$ and $T_d$:

$$T_a=T_{22}-T_{12}=A2+B2-(A1+B2)=A2-A1;\ A2=T_a+A1$$

$$T_b=T_{33}-T_{23}=A3+B3-(A2+B3)=A3-A2;\ A3=T_b+A2$$

$$T_c=T_{44}-T_{34}=A4+B4-(A3+B4)=A4-A3;\ A4=T_c+A3$$

$$T_d=T_{11}-T_{41}=A1+B1-(A4+B1)=A1-A4;\ A1=T_d+A4 \quad (3)$$

Now, by setting a timing error associated with a reference one of the signal paths to a default value (e.g., by setting timing error A1 to zero), the above equations may be solved as follows to determine the relative timing errors introduced by the driver-side signal paths:

$$A2=T_a+A1=T_a+0=T_a$$

$$A3=T_b+A2=T_b+T_a$$

$$A4=T_c+A3=T_c+T_b+T_a$$

$$A1=T_d+A4=T_d+T_c+T_b+T_a \quad (4)$$

Given the above timing errors (A1-A4), appropriate adjustments can be made to an automated circuit test system, or appropriate calibration factors can be stored so that they can be applied to any measurements acquired by the automated circuit test system.

The sets of equations (1) and (2) may also be solved to determine the relative timing errors introduced by the signal paths of the test system including the comparators 210-216. Subtracting the first set of equations (1) from the second set of equations (2) yields the timing errors $T_1$, $T_2$, $T_3$ and $T_4$:

$$T_1=T_{12}-T_{11}=A1+B2-(A1+B1)=B2-B1;\ B2=T_1+B1$$

$$T_2=T_{23}-T_{22}=A2+B3-(A2+B2)=B3-B2;\ B3=T_2+B2$$

$$T_3=T_{34}-T_{33}=A3+B4-(A3+B3)=B4-B3;\ B4=T_3+B3$$

$$T_4=T_{41}-T_{44}=A4+B1-(A4+B4)=B1-B4;\ B1=T_4+B4 \quad (5)$$

Now, by setting a timing error associated with a reference one of the signal paths to a default value (e.g., by setting timing error B1 to zero), the above equations may be solved as follows to determine the relative timing errors introduced by the comparator-side signal paths:

$$B2=T_1+B1=T_1+0=T_1$$

$$B3=T_2+B2=T_2+T_1$$

$$B4=T_3+B3=T_3+T_2+T_1$$

$$B1=T_4+B4=T_4+T_3+T_2+T_1 \quad (6)$$

Given the above timing errors (B1-B4), appropriate adjustments can be made to an automated circuit test system, or appropriate calibration factors can be stored so that they can be applied to any measurements acquired by the automated circuit test system.

Figure 4:
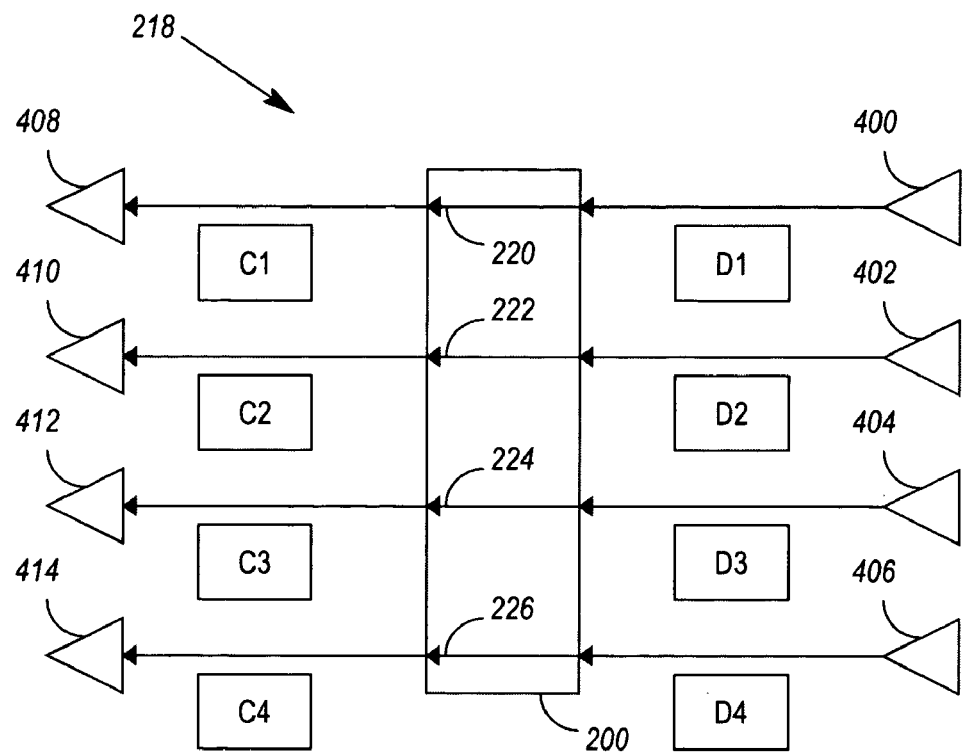
Figure 5:
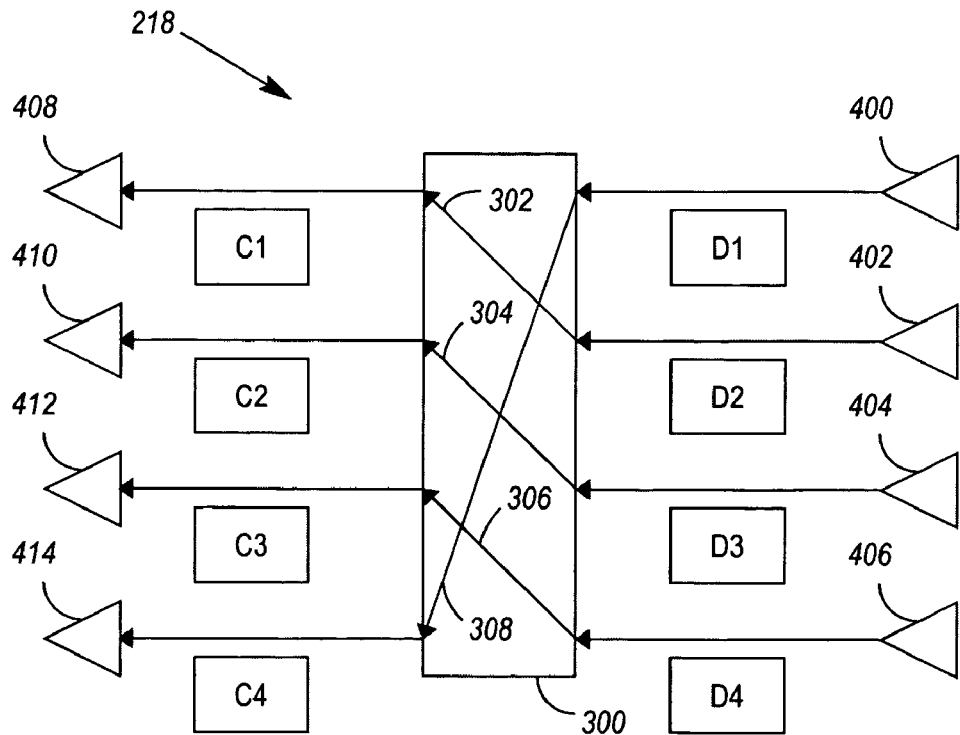

If an automated circuit test system comprises a plurality of signal pins, each of which is connected to both a driver and a comparator 202/408, 204/410, 206/412, 208/414, 400/210, 402/212, 404/214, 406/216, the first and second calibration units 200, 300 may also be used to calibrate the driver/comparator relationships shown in FIGS. 4 & 5. That is, with the first calibration unit 200 placed as shown in FIG. 4, a third AC timing calibration procedure may be executed to acquire a set of timing delays $T_{1-1}$, $T_{2-2}$, $T_{3-3}$ and $T_{4-4}$ may be acquired for the paths represented by timing errors C1-C4 and D1-D4 as follows:

$T_{1-1} = C1 + D1$ $T_{2-2} = C2 + D2$ $T_{3-3} = C3 + D3$ $T_{4-4} = C4 + D4$ \hfill (7)

Likewise, with the second calibration unit 300 placed as shown in FIG. 5, a fourth AC timing calibration procedure may be executed to acquire a set of timing delays $T_{1-2}$, $T_{2-3}$, $T_{3-4}$ and $T_{4-1}$ for the paths represented by the timing errors C1-C4 and D1-D4 as follows:

$T_{1-2} = C1 + D2$ $T_{2-3} = C2 + D3$ $T_{3-4} = C3 + D4$ $T_{4-1} = C4 + D1$ \hfill (8)

The sets of equations (7) and (8) may then be solved similarly to the sets of equations (1) and (2).

In an alternate embodiment, the drivers 400-406 and comparators 408-414 shown in FIGS. 4 & 5 may be tested using a separate set of calibration units.

Preferably, the method 100 is embodied in a computer program comprising code (e.g., sequences of instructions) to execute the various steps thereof. The code may be stored on any one or more computer readable media, including, for example, a memory or a disk which is fixed or removable. In some cases, the computer program may be executed by the automated circuit test system 218 which is being calibrated. In other cases, part or all of the computer program may be executed by one or more computers that are connected to the test system 218 so as to control the operation of the test system 218.

Figure 6:
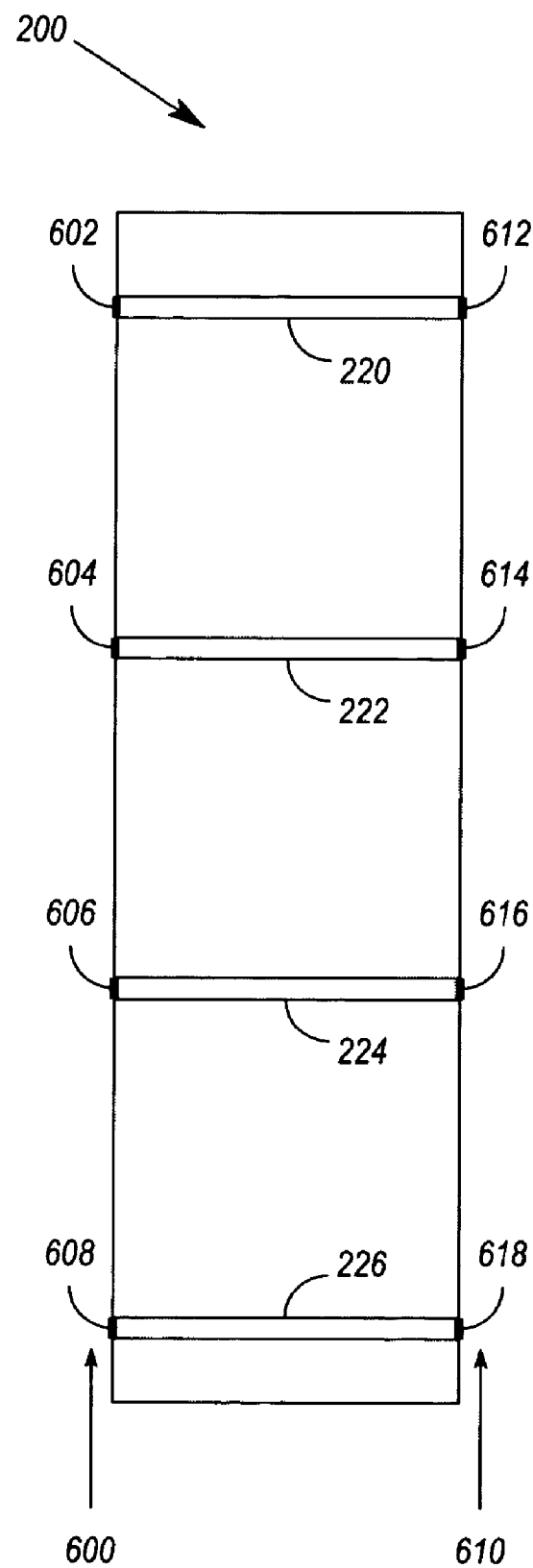
FIG. 6 illustrates an exemplary form of the calibration unit shown in FIGS. 2 & 4.

By way of example, FIG. 6 illustrates the first calibration unit 200 in greater detail. As shown, the calibration unit 200 may comprise a driver interface 600 having multiple driver contacts 602, 604, 606, 608 for electrically coupling the calibration unit 200 to a plurality of drivers of a test system. The calibration unit 200 may also comprise a comparator interface 610 having multiple contacts 612, 614, 616, 618 for electrically coupling the calibration unit 200 to a plurality of comparators of a test system. The calibration unit 200 may also comprise a plurality of fixed wiring paths 220-226 that couple pairs of the calibration unit's driver contacts and comparator contacts 602/612, 604/614, 606/616, 608/618.

In one embodiment, the calibration unit 200 may comprise a substrate on (or in) which its fixed wiring paths are deposited or formed. For example, the calibration unit 200 may comprise an alumina ($Al_2O_3$) substrate on which thin film circuit traces are deposited. Or, for example, the calibration unit 200 may comprise a printed circuit board (PCB) substrate on (or in) which circuit traces are formed. Alternately, the calibration unit 200 may comprise a substrate to which coaxial cables or the like are attached. However, in either case, the fixed wiring paths eliminate mechanical relays or active semiconductor components that can degrade signals or otherwise introduce errors into a calibration process.

In one embodiment, the calibration units 200, 300 are sized to mimic actual devices under test (DUTs) that will be tested by a test system after the test system is calibrated using the calibration units 200, 300. In some cases, this may dictate that the calibration units 200, 300 be shaped to mimic wafers that will be tested by the test system (i.e., if the test system is being used for wafer test). If the calibration units 200, 300 sufficiently mimic the DUTs that are to be tested by a test system, it may be possible for a robotic system to place and remove the calibration units in/from the test system.

The second calibration unit 300 may be constructed similarly to the first calibration unit 200, with the only difference being that the fixed wiring paths of the first calibration unit couple pairs of the calibration unit's driver and comparator contacts in a first set of relationships, and the fixed wiring paths of the second calibration unit couple pairs of the second calibration unit's driver and comparator contacts in a second set of relationships.

The methods and apparatus described herein can be advantageous, in one respect, in that they enable calibration of an automated circuit test system at the system's test socket. During high frequency AC timing calibration, the impedance of a test system's probe card and test socket can be the most significant sources of timing error. Many prior calibration methods have not accounted for probe card and test socket timing error.

Another advantage that may be provided by some or all of the methods and apparatus described herein is the elimination of any need to connect a calibrated driver or comparator to each and every signal pin of a test system. Rather, as few as two channels can be connected to a reference channel, and the timing errors of all other channels can be calculated in a relative manner.

The methods and apparatus disclosed herein can also be used to reduce the time and cost of AC timing calibration. For example, there is no need to reposition a robotic arm to probe each and every signal pin of a test system. Also, the cost of producing the first and second calibration units is minimal compared to 1) the cost of a robot, or 2) the cost of a relay signal selector containing active mechanical or semiconductor components.

The methods and apparatus disclosed herein can also provide good reliability, as there are no active components that are subject to failure.

Figure 7:
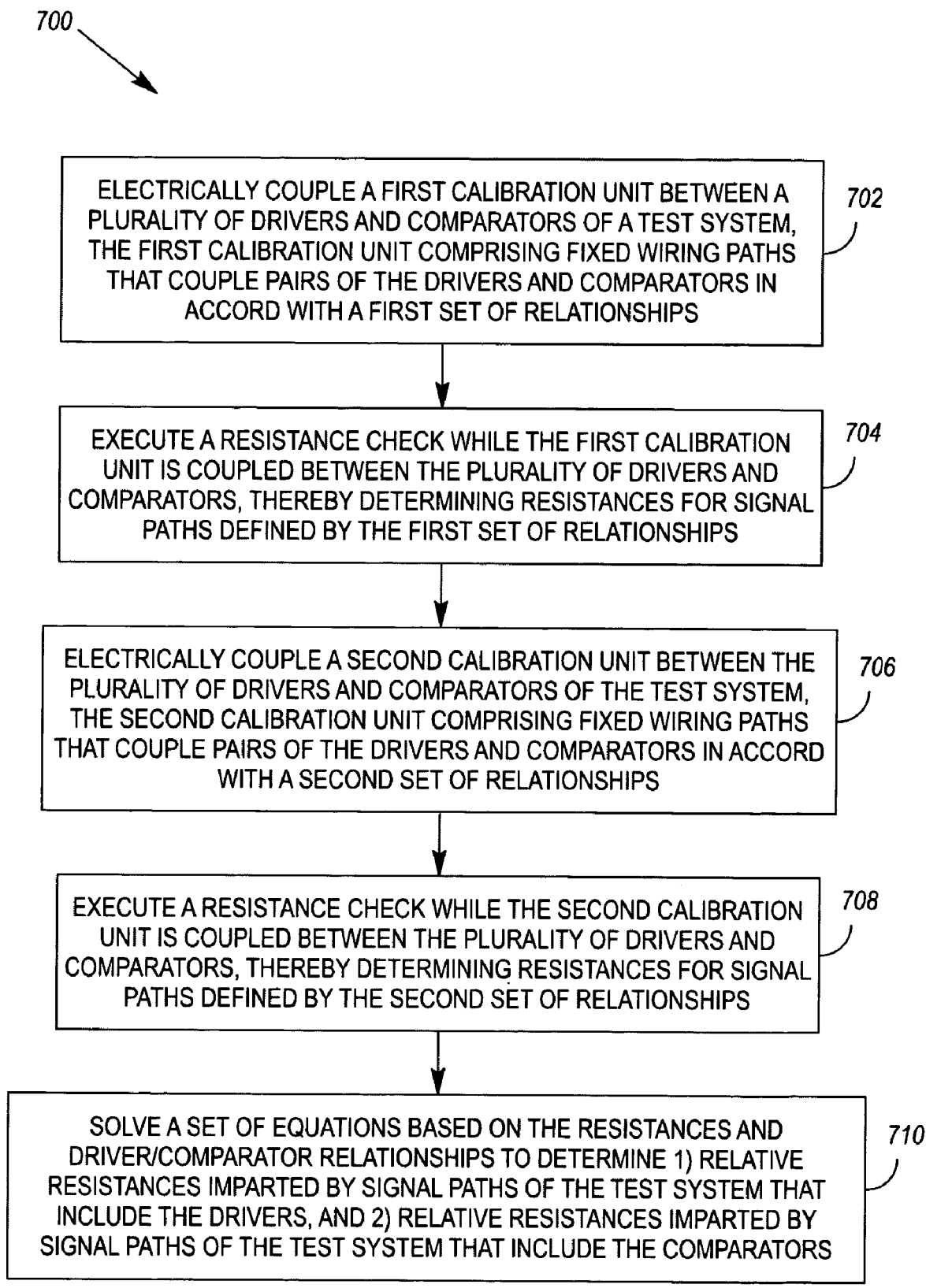
FIG. 7 illustrates a second exemplary method for calibrating an automated circuit test system.

In addition to AC timing calibration, the methods and apparatus disclosed herein have other applications. For example, FIG. 7 illustrates a second exemplary method 700 for calibrating an automated circuit test system. In the method 700, a resistance check is executed 704 while the first calibration unit 200 is coupled 702 between the drivers and comparators of a test system. In this manner, a plurality of resistances corresponding to the signal paths defined by the wiring relationships of the first calibration unit 200 may be determined. A second resistance check may then be executed 708 while the second calibration unit 300 is coupled 706 between the drivers and comparators of the test system. In this manner, a plurality of resistances corresponding to the signal paths defined by the wiring relationships of the second calibration unit 300 may be determined. In one embodiment, the resistance checks are DC resistance variation tests that are performed using the driver-side current source or comparator-side voltage source of a test system's DC parametric test unit (PMU).

Similarly to how the timing error equations were solved, supra, a set of equations may be solved 710 based on the resistances and driver/comparator relationships to determine i) relative resistances imparted by signal paths of the test system that include the drivers, and ii) relative resistances imparted by signal paths of the test system that include the comparators. Determining DC resistance variations is useful because, before executing an AC timing calibration test, it is desirable to know the signal path contact resistance variation.

What is claimed is:

1. A method for calibrating an automated circuit test system, comprising:

electrically coupling a first calibration unit between a plurality of drivers and comparators of the test system, the first calibration unit comprising fixed wiring paths that couple the drivers and comparators to form a first set of signal paths between a first set of driver and comparator pairs;

executing a resistance check while the first calibration unit is coupled between the plurality of drivers and comparators, thereby determining resistances for the first set of signal paths;

electrically coupling a second calibration unit between the plurality of drivers and comparators, the second calibration unit comprising fixed wiring paths that couple the drivers and comparators to form a second set of signal paths between a second set of driver and comparator pairs;

executing a resistance check while the second calibration unit is coupled between the plurality of drivers and comparators, thereby determining resistances for the second set of signal paths; and solving a set of equations based on the resistances and the first and second sets of driver and comparator pairs to determine i) relative resistances imparted by signal paths of the test system that include the drivers, and ii) relative resistances imparted by signal paths of the test system that include the comparators.

2. The method of claim 1, wherein the set of equations is solved, in part, by i) setting a resistance associated with a reference one of the signal paths including one of the drivers to a default value, and ii) setting a resistance associated with a reference one of the signal paths including one of the comparators to a default value.

* * * * *